United States Patent
Haskins et al.

(10) Patent No.: US 8,417,859 B2
(45) Date of Patent: Apr. 9, 2013

(54) LOW POWER, LOW MASS, MODULAR, MULTI-BAND SOFTWARE-DEFINED RADIOS

(75) Inventors: Christopher B. Haskins, Crownsville, MD (US); Wesley P. Millard, Columbia, MD (US)

(73) Assignee: The Johns Hopkins University, Baltimore, MD (US)

( * ) Notice: Subject to any disclaimer, the term of this patent is extended or adjusted under 35 U.S.C. 154(b) by 862 days.

(21) Appl. No.: 12/569,122

(22) Filed: Sep. 29, 2009

(65) Prior Publication Data
US 2012/0252387 A1 Oct. 4, 2012

Related U.S. Application Data

(60) Provisional application No. 61/101,189, filed on Sep. 30, 2008.

(51) Int. Cl.
| | | |
|---|---|---|
| G06F 13/12 | (2006.01) | |
| G06F 13/38 | (2006.01) | |
| G06F 3/033 | (2006.01) | |
| H03D 7/16 | (2006.01) | |

(52) U.S. Cl. ............................. 710/74; 455/130; 455/131
(58) Field of Classification Search .......................... None
See application file for complete search history.

(56) References Cited

U.S. PATENT DOCUMENTS

| 7,079,846 B2 | 7/2006 | Wasko |
| 7,483,933 B2 | 1/2009 | Wang et al. |
| 7,493,141 B2 | 2/2009 | Brobston et al. |
| 7,764,751 B1 * | 7/2010 | Hammell et al. ............. 375/343 |
| 7,991,013 B2 * | 8/2011 | Gupta et al. ................. 370/481 |
| 2007/0171312 A1 * | 7/2007 | Kishi ............................. 348/726 |
| 2007/0190994 A1 | 8/2007 | Sakai et al. |
| 2008/0051099 A1 | 2/2008 | Moore et al. |
| 2008/0311866 A1 | 12/2008 | Roux et al. |
| 2009/0180524 A1 * | 7/2009 | Wang et al. ................... 375/149 |
| 2010/0067634 A1 * | 3/2010 | Furman et al. ................ 375/376 |

OTHER PUBLICATIONS

Deboy, C.C. et al., "The RF Telecommunications System for the New Horizons Mission to Pluto," in Proc. 2004 IEEE Aerosp. Conf. Mar. 2004.
Haskins, C.B. et al., "X-band Digital Receiver for the New Horizons Spacecraft," in Proc. 2004 IEEE Aerosp. Conf., Mar. 2004.
Haskins, C.B. et al., "Microwave Technologies for the New Horizons Mission to Pluto," IEEE MTT, Jun. 2007.
Haskins, C.B. et al., "Flexible, Coherent Digital Transceiver for Low Power Space Missions," IEEE Aerosp. Conf., Mar. 2006.

* cited by examiner

*Primary Examiner* — Kris Rhu
(74) *Attorney, Agent, or Firm* — Noah J. Hayward

(57) ABSTRACT

Methods and systems to implement and operate software-defined radios (SDRs). An SDR may be configured to perform a combination of fractional and integer frequency synthesis and direct digital synthesis under control of a digital signal processor, which may provide a set of relatively agile, flexible, low-noise, and low spurious, timing and frequency conversion signals, and which may be used to maintain a transmit path coherent with a receive path. Frequency synthesis may include dithering to provide additional precision. The SDR may include task-specific software-configurable systems to perform tasks in accordance with software-defined parameters or personalities. The SDR may include a hardware interface system to control hardware components, and a host interface system to provide an interface to the SDR with respect to a host system. The SDR may be configured for one or more of communications, navigation, radio science, and sensors.

20 Claims, 8 Drawing Sheets

LOW POWER, LOW MASS, MODULAR, MULTI-BAND SOFTWARE-DEFINED RADIOS

CROSS REFERENCE TO RELATED APPLICATIONS

This application claims the benefit of U.S. Provisional Patent Application No. 61/101,189, titled "Low Power, Low Mass, Modular, Multi-Band Software-defined Radio for Communications, Navigation, Radio Science, and Sensors," to Christopher B. Haskins et. al, filed Sep. 30, 2008, which is incorporated herein by reference in its entirety.

STATEMENT OF GOVERNMENTAL INTEREST

This invention was made with U.S. Government support under the National Aeronautics and Space Administration (NASA), contract number NNXD06AH71G. The United States Government has certain rights in the invention.

BACKGROUND

1. Technical Field

Disclosed herein are methods and systems to implement and operate modular software-defined radios (SDRs), including SDRs for terrestrial and extraterrestrial use.

2. Related Art

Software-defined radios (SDRs) arose in the late 1970s in the defense sector. The term "software-defined radio" has been in use since at least 1991. An early U.S. military SDR initiative, named SpeakEasy, sought to use programmable processing to emulate multiple existing military radios operating in frequency bands between 2 and 2000 MHz, and to enable incorporation of new coding and modulation techniques in the future.

SDR development is driven predominantly by terrestrial needs, including military and emergency response needs, such as to provide interoperability amongst different equipment. For example, the U.S. military has developed a Joint Tactical Radio System to provide flexible and interoperable communications amongst hand-held, vehicular, airborne, dismounted, fixed base-station, and maritime radios.

Extraterrestrial environments present challenges that may not be encountered to the same degree in terrestrial environments, such as physical inaccessibility, higher signal propagation frequencies, radiation, relatively vast distances between transmitters and receivers, different mission requirements, and more onerous limitations on size, mass, and power consumption.

Designs developed for terrestrial applications are not necessarily suitable for extraterrestrial environments, and do not necessarily satisfy extraterrestrial challenges. Limited resources allotted for extraterrestrial programs may necessitate unconventional configurations of commercially available components, rather than design and manufacture of new components.

SUMMARY

Disclosed herein are methods and systems to implement and operate software-defined radios (SDRs).

An SDR may be configured to perform a combination of numerically controlled fractional and integer frequency synthesis and direct digital synthesis to provide a set of relatively agile, flexible, low-noise, and low spurious, timing and frequency conversion signals. Frequency synthesis may include dithering to provide additional precision. Direct digital synthesis, mixing, sampling, sub-sampling, clock synthesis, and frequency synthesis, including dithering, or portions thereof, may be performed in hardware, firmware, software-configurable firmware, a processor in response to software, and combinations thereof.

An SDR may include software-configurable firmware modules to perform processing tasks in accordance with one or more software-defined personalities, wherein a personality may include a set of software-defined parameters.

Software configurable firmware modules may include one or more of a carrier tracking module to correct Doppler-induced errors in a receive path, a channel select module to define or select down-conversion channel frequencies and bandwidths and to demodulate data, a coherency calculation module to perform mathematics and signal processing to maintain an exciter path carrier signal coherent with a received signal in accordance with a turn-around ratio, an encoder module, including one or more encoder sub-modules, each configured to provide a corresponding encoding framework, a hardware interface firmware module to control receiver and exciter slices, and a host interface module to provide an interface to the SDR with respect to a host system.

Additional features and exemplary embodiments are provided in the description below and the accompanying drawings.

BRIEF DESCRIPTION OF THE DRAWINGS/FIGURES

Figure 1:
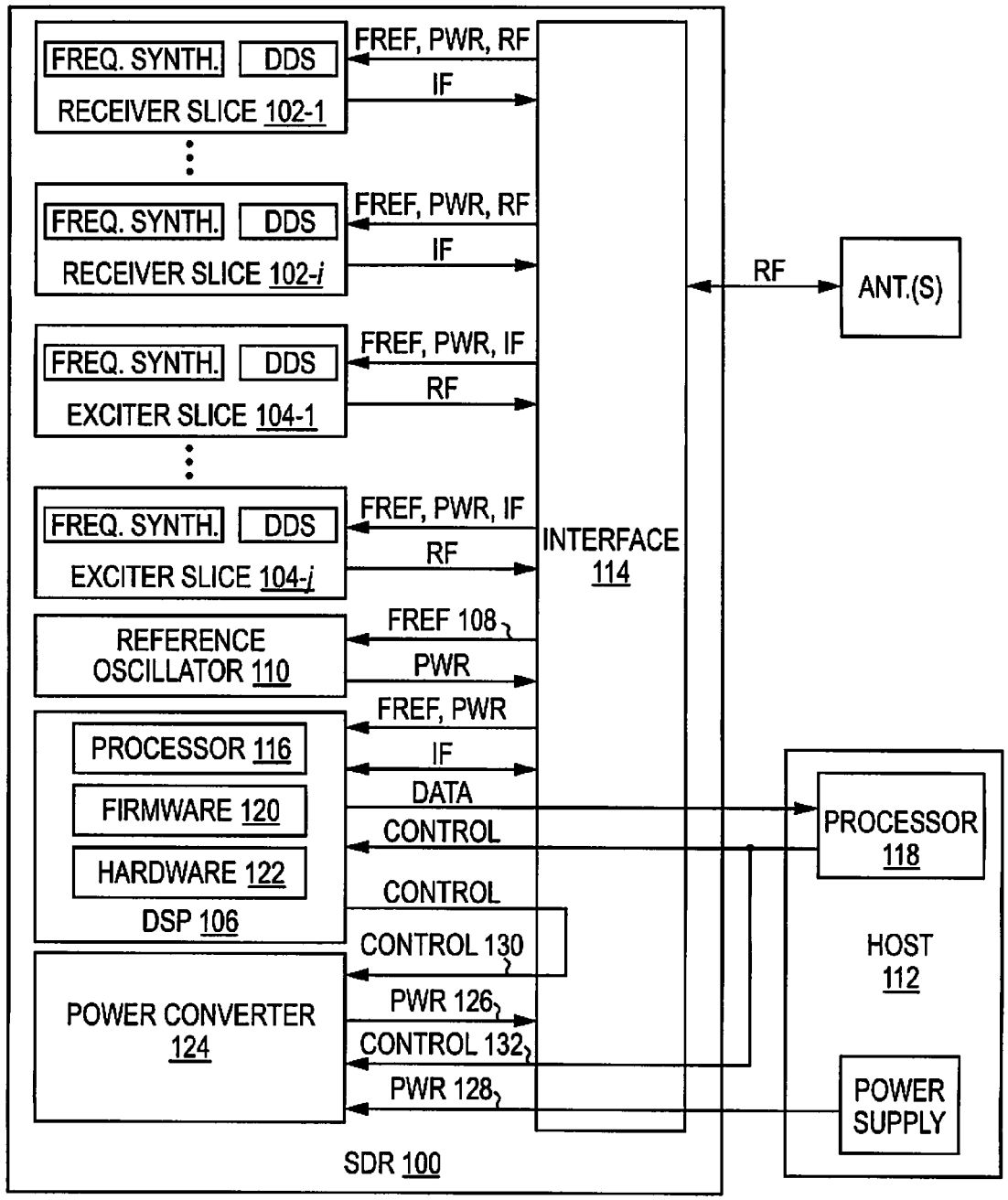
FIG. 1 is a block diagram of an exemplary modular software-defined radio (SDR), including one or more receiver slices, one or more exciter slices, and a digital signal processor (DSP).

In the drawings, the leftmost digit(s) of a reference number identifies the drawing in which the reference number first appears.

DETAILED DESCRIPTION

FIG. 1 is a block diagram of an exemplary modular software-defined radio system (SDR) 100, including one or more hardware-based receiver slices 102-1 through 102-$i$, one or more hardware-based exciter slices 104-1 through 104-$j$, and a digital signal processor (DSP) 106. DSP 106 may include an instruction processor 116, firmware 120, and hardware 122.

Exemplary signal processing tasks are disclosed herein with reference to one or more of a receiver slice 102, and exciter slice 104, DSP 106, processor 116, firmware 120, and hardware 122. The exemplary signal processing tasks are not, however, limited to exemplary referenced elements. Distribution of signal processing tasks amongst a receive slice 102, an exciter slice 104, and DSP 106, and amongst processor 116, firmware 120, and hardware 122, may be adjusted to optimize power efficiency. For example, as component technology and corresponding power efficiencies improve, signal processing tasks may be shifted from slices 102 and/or 104 to DSP 106, and/or from hardware 122 towards firmware 120 and/or processor 116, which may enable more advanced user-defined features.

DSP 106 may include one or more of a field programmable gate array (FPGA) and an application specific integrated circuit (ASIC).

Hardware 122 may include circuits and devices, such as analog-to-digital converters (ADCs), digital-to-analog converters (DACs), digital frequency synthesizers, frequency synthesizers, and memory.

Processor 116 may be configured to provide software-defined receive and transmit channel assignments to firmware 120, and to provide an interface to a host system 112, such as to permit a host processor 118 to operate SDR 100. Host processor 118 may be responsible for command and data handling of host 114.

Processor 116 may include a reduced instruction set computing (RISC) architecture processor, such as a MIPS processor developed by MIPS Technologies, Inc., formerly MIPS Computer Systems, Inc.

Processor 116 may be implemented within firmware 120 or outside of firmware 120, such as a separate hardware module or slice, and may be configured to operate under control of an operating system and to execute applications programs within a corresponding operating environment. The applications may include applications to control functions of SDR 100. This may be useful, for example, with respect to communication-intensive missions, such as a multi-user mission.

SDR 100 may be configurable to operate without processor 116, and may be configured to operate under direct control of host processor 118. This may reduce overall mass and power requirements.

Firmware 120 and associated software may provide one or more of RF hardware interface abstraction, user/host interface abstraction, firmware modularity, software re-configurability, radio auto-tuning, in-flight waveform manipulation within receiver slices 102 and exciter slices 104, and radiation mitigation.

Firmware 120 may include software-configurable firmware to selectively configure SDR 100 with respect to, for example and without limitation, one or more: of receive frequencies and bandwidths, transmit frequencies and bandwidths, a turn-around ratio, demodulation and modulation schemes, clock rates, and analog-to-digital (ADC) sampling/sub-sampling rates.

DSP 106 may be configured to selectively operate a receiver slice 102 and an exciter slice 104 independently of one another, or to synthesize a two-way coherent carrier to operate the receiver slice 102 and the exciter slice 104 coherently with respect to one another, in accordance with a turn-around ratio. Coherent operation may be useful with respect to, for example, Doppler navigation, sensor, and/or radio science applications.

DSP 106 may be configured to provide a relatively flexible coherent turnaround ratio, which may used in conjunction with one or more multiple spacecraft per aperture (MSPA) techniques, such as shared uplink command and two-way radiometric tracking services. An uplink may service multiple spacecraft, as each radio can be in-flight tuned to a current uplink frequency using a spacecraft ID as a discriminator for specific commands. The flexible turnaround ratio may permit multiple spacecraft to lock to a single uplink signal and coherently generate a downlink at a corresponding assigned frequency channel, which may permit increased data throughput and/or increased tracking data. This may help to minimize mass and costs of a spacecraft and/or to more efficiently use ground-based resources.

SDR 100 may include relatively general purpose modulators and demodulators, such as vector modulators and vector demodulators, which may provide flexibility. Baseband in-phase and quadrature (I/Q) data waveforms may be generated using a pair of relatively high speed digital-to-analog converters (DACs) and firmware 120.

SDR 100 may include a digitally-controlled frequency control system to generate and synthesize frequency conversion signals from a reference signal fref 108. The digitally-controlled frequency control system may provide numerically controlled tracking and synthesis. The frequency control system may be configured to perform one or more of direct digital synthesis, numerically-controlled frequency synthesis, dithering, and combinations thereof, to provide relatively agile, flexible, low-noise, and low spurious, timing and frequency conversion signals.

DSP 106 may include a plurality of software-selectable sets of configuration parameters or personalities, which may be selectively applied to the software-configurable firmware. The parameters may be associated with one or more of direct digital synthesis, numerically-controlled frequency synthesis, clock rates, and dithering, and each set of parameters may be associated with one or more of a receive frequency and bandwidth, a transmit frequency and bandwidth, and a turn-around ratio.

SDR 100 may include a reference oscillator 110 to generate reference signal fref 108. Reference oscillator 110 may include a relatively low power, low phase noise oscillator, such as an oven controlled crystal oscillator (OCXO) or a temperature compensated crystal oscillator (TCXO). Reference oscillator 110 may be implemented as a separate module, or may be incorporated within another component of SDR 100. Reference oscillator 110 may be implemented in a modular fashion, such as to permit substitution of an oscillator with another oscillator. Alternatively, SDR 100 may be configured to receive reference signal fref 108 from an ultra-stable oscillator (USO), such as from a host 112, which may correspond to an aircraft and/or a space craft.

SDR 100 may include an interface 114 to interface amongst components of SDR 100 and/or host 112. Interface 114 may include one or more connector planes, and one or more components of SDR 100 may be configured to plug into the connector plane(s). Alternatively, or additionally, one or more components of SDR 100 may be hard wired to interface 114 and/or directly connected to one or more other components of SDR 100 and/or to host 112. Interface 114 may include one or more shared bus interfaces, which may include a serialized data bus. This may be useful, for example, where a relatively large number of receiver slices 102 and exciter slices 104 are implemented.

Interface 114 may include, for example, one or more of a Spacewire, a LVDS, a RS-422, a RS-232, an Ethernet, and/or a custom or proprietary interface. Spacewire refers to a spacecraft communication network based in part on an Institute of Electrical and Electronics Engineer (IEEE) standard 1355, titled, "Heterogeneous Interconnect." LVDS refers to a low-voltage differential signaling system that can run at relatively high speeds over twisted-pair cables.

SDR 100 may include a power converter 124 to provide one or more voltage levels 126 to components of SDR 100. Power converter 124 may receive power 128 from host 112, and may receive one or more control signals 130 from DSP 106 and/or 132 from host 112.

Additional exemplary features of SDR 100 are disclosed below with reference to FIGS. 2-8, one or more of which include exemplary frequencies and bandwidths. For example, receiver slice 102-2 is described below with respect to an exemplary S-band configuration, and exciter slices 104-1 and 104-2 are described below with respect to exemplary S-band and Ka-band configurations, respectively. SDR 100 is not, however limited to the exemplary frequencies and bandwidths. SDR 100 may be configured receive and/or transmit one or more of electromagnetic (EM) signals, including radio frequency (RF) signals, and optical signals.

Figure 2:
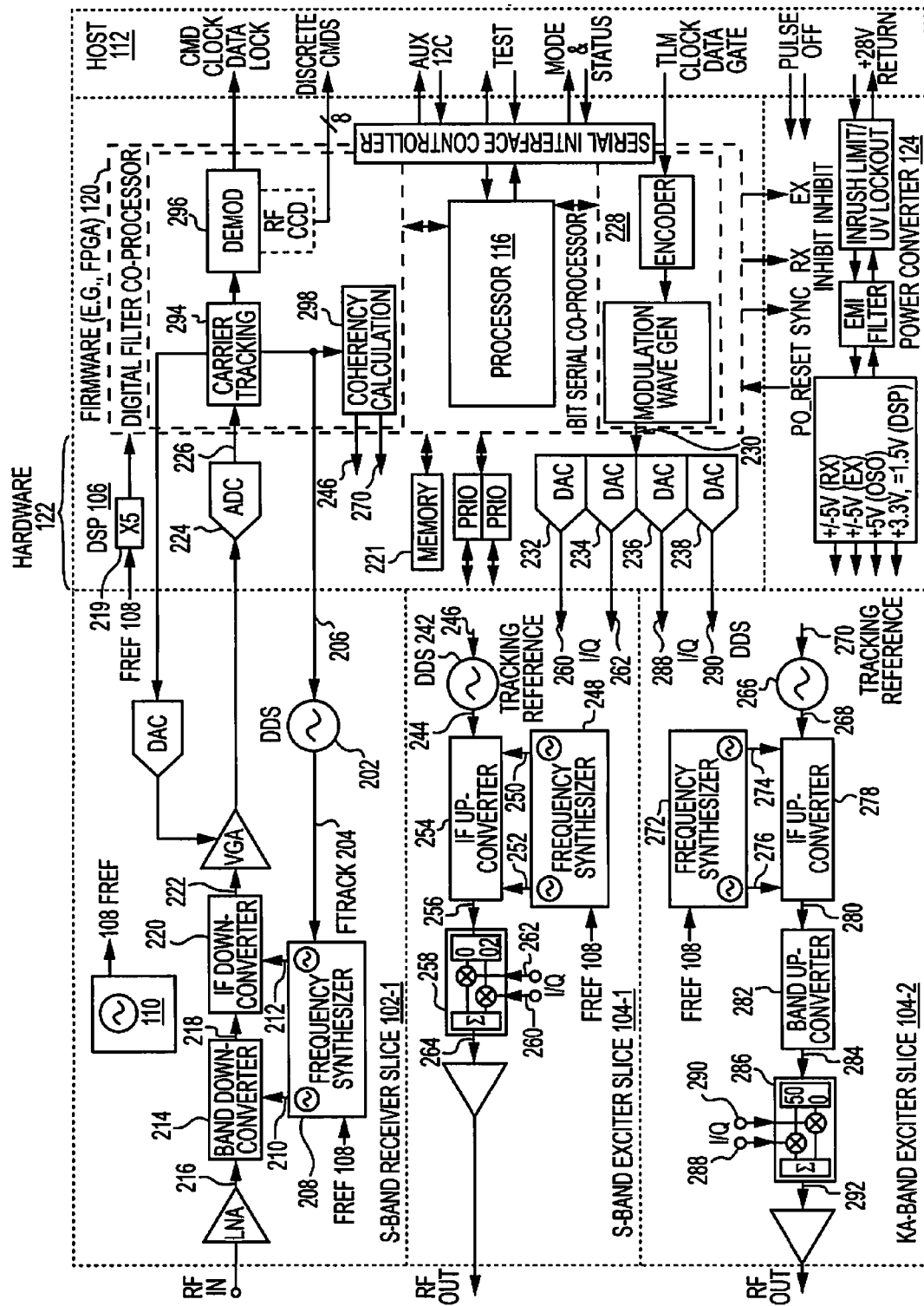
FIG. 2 is an exemplary block diagram of the SDR, including an S-band receiver slice, an S-band exciter slice, a Ka-band exciter slice, and software-configurable firmware within the DSP.

FIG. 2 is an exemplary block diagram of SDR 100, including an S-band receiver slice 102-1, an S-band exciter slice 104-1, and a Ka-band exciter slice 104-2. Receive path processing is described below. Transmit path processing is described further below.

In FIG. 2, DSP 106 may include one or more relatively low-phase noise, software-configurable clock multipliers and/or dividers to generate one or more corresponding system clock signals from reference signal fref 108. In the example of FIG. 2, DSP 106 includes a clock multiplier 219, illustrated here as a 5× multiplier, which may generate a 150-MHz clock from a 30-MHz reference signal fref 108. DSP 106 may include one or more software-configurable clock frequency translators, which may include one or more numerically-controlled clock frequency translators, to generate one or more additional system clock signals.

In FIG. 2, S-band receiver slice 102-1 includes a two-stage super heterodyne down converter, including a band down-converter 214 and an IF down-converter 220.

S-band receiver slice 102-1 further includes a numerically-controlled oscillator, illustrated here as a directed digital synthesis (DDS) module 202 to generate a reference tracking signal ftrack 204 from a carrier tracking signal 206, and a frequency synthesizer 208 to generate first and second down-converter reference signals 210 and 212 from reference tracking signal ftrack 204.

Firmware 120 may include software-configurable carrier tracking firmware 294 to generate carrier tracking signal 206 and to perform automatic gain control (AGC), alone or in combination with hardware 122. Carrier tracking firmware 294 may be implemented within a filter firmware module, such as described below with respect to FIG. 8. The filter firmware may be configured, for example, to execute transfer function mathematics associated with one or more of filtering, gain, and logic control of processing loops, which may include one or more of automatic gain control (AGC), sub-carrier symbol tracking, coherency, and phase locking.

Band down-converter 214 is configured to down-covert a received signal 216 to a first IF signal 218 in response to first down-converter reference signal 210.

IF down-converter 220 is configured to down-convert first IF signal 218 to a second IF signal 222 in response to second down-converter reference signal 212.

Frequency synthesizer 208 may be controllable by DSP 106 to define frequency down-conversion channels. DDS module 202 may be controllable by DSP 106 to provide relatively finely tunable frequency agility to frequency synthesizer 208, which may be useful, for example, with Doppler navigation, sensor, and/or radio science applications.

Frequency synthesizer 208 may include a fractional and integer frequency synthesizer to generate first down-conversion reference signal 210 to have a frequency that is N1/M1 times a frequency of tracking reference signal /track 204, and to generate second down-conversion reference signal 212 to have a frequency that is N2/M2 times a frequency of tracking reference signal ftrack 204. N1, M1, N2, and N2 may include software-defined or selectable integers and/or fractions of integers.

Frequency synthesizer 208 may provide relatively fine frequency resolution with relatively low values of N, which may provide loop architectures with relatively low phase noise and relatively fast settling times, and which may provide relatively wide closed and open loop bandwidths.

Figure 3:
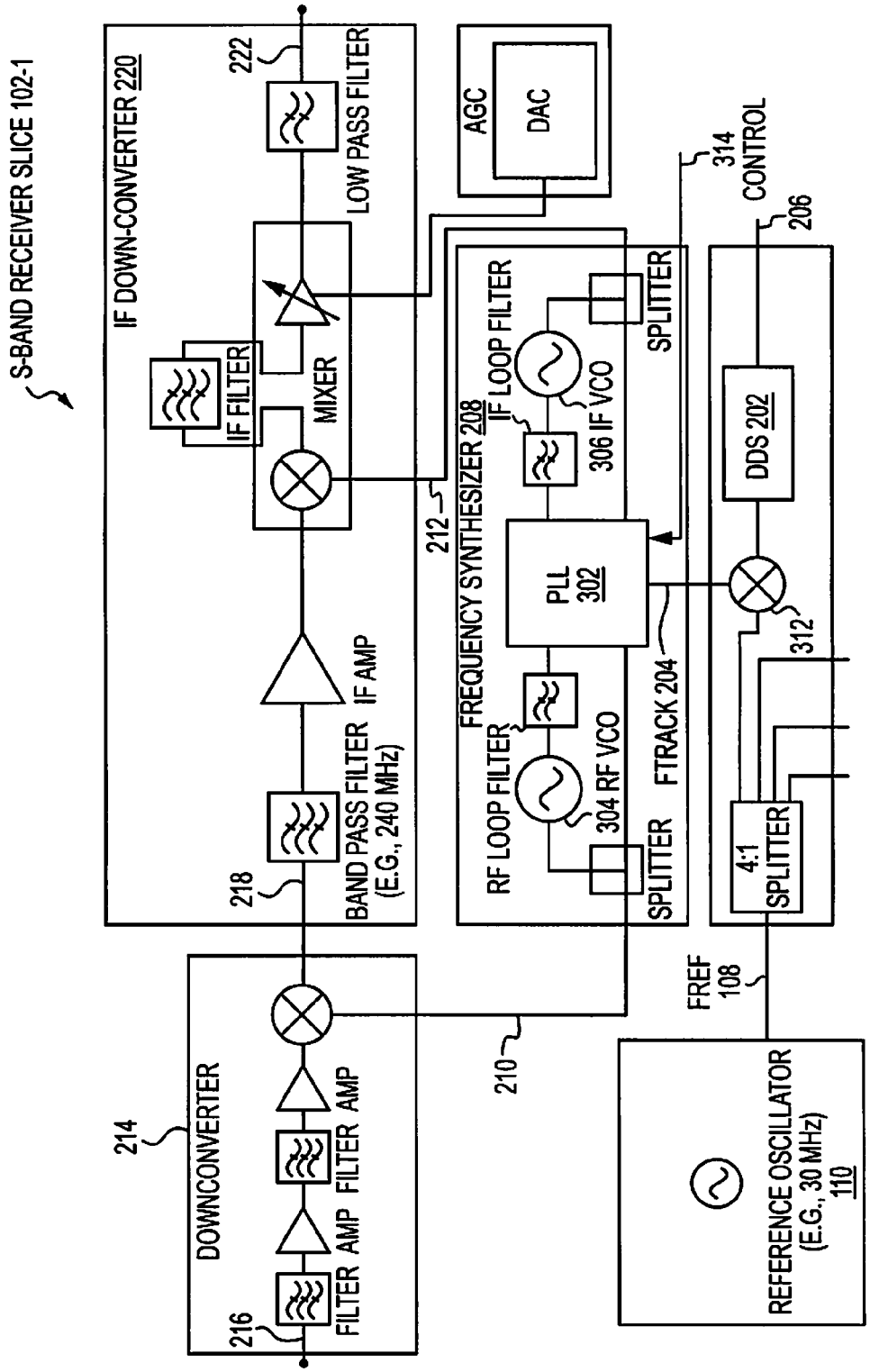
FIG. 3 is an exemplary block diagram of the S-band receiver slice.

FIG. 3 is an exemplary block diagram of receiver slice 102-1, including a frequency translator 312, which may include a mixer, to generate tracking reference signal ftrack 204 from an output of DDS module 202.

In FIG. 3, frequency synthesizer 208 includes a dual phase locked loop (PLL) 302 and first and second voltage controlled oscillators (VCOs) 304 and 306, to generate first and second down-converter reference signals 210 and 212, respectively, from tracking reference signal ftrack 204. PLL 302 may be controllable by DSP 106 through a control 314.

In FIG. 2, DSP 106 includes one or more analog-to-digital converters (ADCs), each to support one or more corresponding receiver slices 102 and/or or other functions, such as sensors. The one or more ADCs may be controllable by firmware 120.

In the example of FIG. 2, DSP 106 includes an ADC 224 to sample or under-sample IF signal 222. ADC 224 may sample or under-sample signal 222 at a software-controllable rate.

Resultant samples 226 are processed and demodulated to baseband I and Q waveforms within DSP 106. Demodulation may be performed within demodulation firmware 296, which may provide flexibility. Demodulation firmware 296 may be software-configurable, which may provide additional flexibility.

Demodulation firmware 296 may be implemented within channel select firmware, such as described below with respect to FIG. 8. The channel select firmware may further include firmware to reconfigure receive and transmit channel assignments and bandwidths. Reconfiguration of channel assignments may be controlled within associated band allocations.

Demodulation firmware 296 may be software-configurable to demodulate data that was modulated in accordance with one or more of a plurality of modulation scheme. Agility provided by direct digital synthesis, numerically-controlled frequency synthesis, and/or digitally controlled dithering, may permit demodulation firmware 296 to demodulate data that was modulated in accordance with one or more relatively complex modulation and pulse shaping schemes, which may include, for example and without limitation, quadrature phase shift keying (QPSK), M-ary phase shift keying (M-PSK), quadrature amplitude modulation (QAM), M-ary QAM (M-QAM), and Gaussian minimum shift keying (GMSK).

Firmware 120 may include software-configurable decoding firmware to decode demodulated data. The decoding firmware may include, for example and without limitation, one or more of a command executor and a Viterbi decoder. DSP 106 may include a plurality of software-selectable radio configurations or personalities and/or may be configured to receive new personality up-loads, and the decoding firmware may be configured to apply a corresponding software-selected decoding personality.

Transmit path processing is now described.

In FIG. 2, firmware 120 may include baseband modulation firmware 228 to generate unfiltered in-phase and quadrature phase (I/Q) symbols 230.

Baseband modulation firmware 228 may be software-configurable to generate (I/Q) symbols 230 in accordance with one or more of a plurality of modulation and/or pulse shaping schemes. Agility provided by direct digital synthesis and numerically-controlled frequency synthesis may permit baseband modulation firmware 229 to modulate with respect to one or more relatively complex modulation and pulse shaping schemes, at relatively high data or sample clock rates. Exemplary modulation schemes include, without limitation, QPSK, M-PSK, QAM, M-QAM, and GMSK, and oversampled and digitally pulse shaped I/Q waveforms. Such agility may also permit baseband modulation firmware 229 and/or other elements to implement relatively complex pre-distortion schemes, such as to compensate for non-ideal system effects, such as power amplifier distortion.

Hardware 122 may include a pair of I and Q digital to analog converters (DACs) for each exciter slice 104 supported by SDR 100. In the example of FIG. 2, hardware 122 includes DACs 232 and 234 corresponding to S-band exciter 104-1, and DACs 236 and 238 corresponding to Ka-band exciter 104-2.

In the example of FIG. 2, S-band exciter slice 104-1 includes a numerically-controlled oscillator, illustrated here as a DDS module 242 to generate a relatively low-frequency carrier signal 244 from a tracking reference signal 246, and a frequency synthesizer 248 to generate first and second up-conversion reference signals 250 and 252 from reference signal fref 108. S-band exciter slice 104-1 further includes a two-stage super heterodyne IF up-converter 254 to frequency up-convert carrier signal 244 to an S-band signal carrier 256.

Frequency synthesizer 248 may be controllable by DSP 106 to define approximate frequency up-conversion channels. DDS module 242 may be controllable by DSP 106 to provide relatively finely tunable frequency agility, which may be useful, for example, with Doppler navigation, sensor, and/or radio science applications.

Frequency synthesizer 248 may include a fractional and integer frequency synthesizer to generate first up-conversion reference signal 250 to have a frequency that is N3/M3 times a frequency of reference signal fref 108, and to generate second up-conversion reference signal 252 to have a frequency that is N4/M4 times a frequency reference signal fref 108. N3, M3, N4, and N4 may include software-defined or selectable integers and/or fractions of integers.

S-band exciter slice 104-1 further includes an I/Q modulator 258 to modulate S-band carrier signal 256 with I and Q signals 260 and 262, to sum the results, and to output an S-band modulated carrier signal 264.

Figure 4:
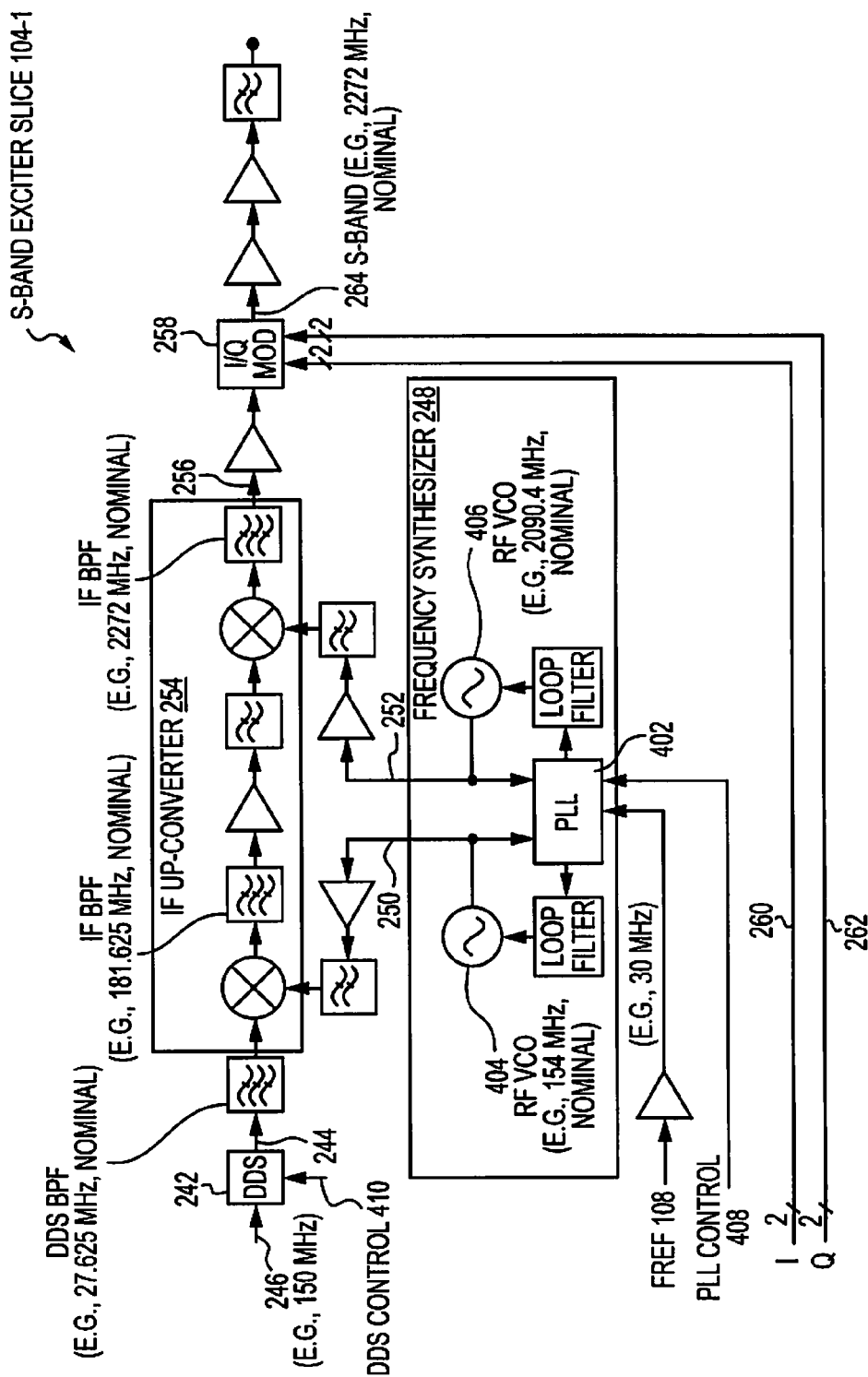
FIG. 4 is an exemplary block diagram of the S-band exciter slice.

FIG. 4 is an exemplary block diagram of S-band exciter slice 104-1, wherein frequency synthesizer 248 includes a dual phase locked loop (PLL) 402 and first and second voltage controlled oscillators 404 and 406, to generate first and second up-conversion reference signals 250 and 252, respectively, from reference signal fref 108. PLL 402 may be controllable by DSP 106 through a control 408.

In FIG. 2, at least a portion of Ka-band exciter slice 104-2 may be configured similarly to S-band exciter slice 104-1. For example, Ka-band exciter slice 104-2 may include a numerically-controlled oscillator, illustrated here as a DDS module 266 to generate a relatively low-frequency carrier signal 268 from a tracking reference signal 270, and a frequency synthesizer 272 to generate first and second up-conversion reference signals 274 and 276 from reference signal fref 108. Ka-band exciter slice 104-2 further includes a two-stage super heterodyne IF up-converter 278 to frequency up-convert carrier signal 268 to a carrier signal 280, which may correspond to an S-band carrier signal.

One or more up-converter stages of IF up-converter 278 may be tuned to a different frequency than corresponding up-converter stages of IF up-converter 254 in S-band exciter slice 104-1.

Frequency synthesizer 272 may be controllable by DSP 106 to define approximate frequency up-conversion channels. DDS module 266 may be controllable by DSP 106 to provide relatively finely tunable frequency agility.

Frequency synthesizer 272 may include a fractional and integer frequency synthesizer to generate first up-conversion reference signal 274 to have a frequency that is N5/M5 times a frequency of reference signal fref 108, and to generate second up-conversion reference signal 276 to have a frequency that is N6/M6 times a frequency reference signal fref 108. N5, M5, N6, and N6 may include software-defined or selectable integers and/or fractions of integers.

Ka-band exciter slice 104-2 may include a band up-converter 282 to up-convert carrier signal 280 to a Ka-band carrier signal 284. Band up-converter 282 may include multiple up-conversion stages, such as a 4× up-converter stage, which may be useful, for example, to generate an X-band carrier signal. Band up-converter 282 may include a subsequent 3× up-converter stage, which may be useful to up-convert from X-band to Ka-band, which may include a frequency of approximately 26 GHz. Alternatively, or additionally, band up-converter 282 may include a second 4× up-converter stage to up-convert from X-band to a frequency in a range that includes one or more of 32 GHz and 38 GHz. A frequency multiplier may be useful, for example, where a suitable mixer is not commercially available for a desired up-conversion step or a desired up-converted frequency.

Ka-band exciter slice 104-2, and/or S-band exciter slice 104-1, may include one or more additional frequency synthesizers, which may provide additional band-conversion flexibility.

Ka-band exciter slice 104-2 further includes an I/Q modulator 286 to modulate carrier signal 284 with I and Q signals 288 and 290, to sum the results, and to output a modulated carrier signal 292.

In the example of FIG. 2, I/Q modulation in exciter slices 104-1 and 104-2 is performed subsequent to frequency up-conversion of corresponding carrier signals. Alternatively, I/Q modulation may be performed prior to or during frequency up-conversion of a corresponding carrier signal. Performance of I/Q modulation subsequent to carrier up-conversion may permit a carrier signal to modulate with greater data bandwidth.

Figure 5:
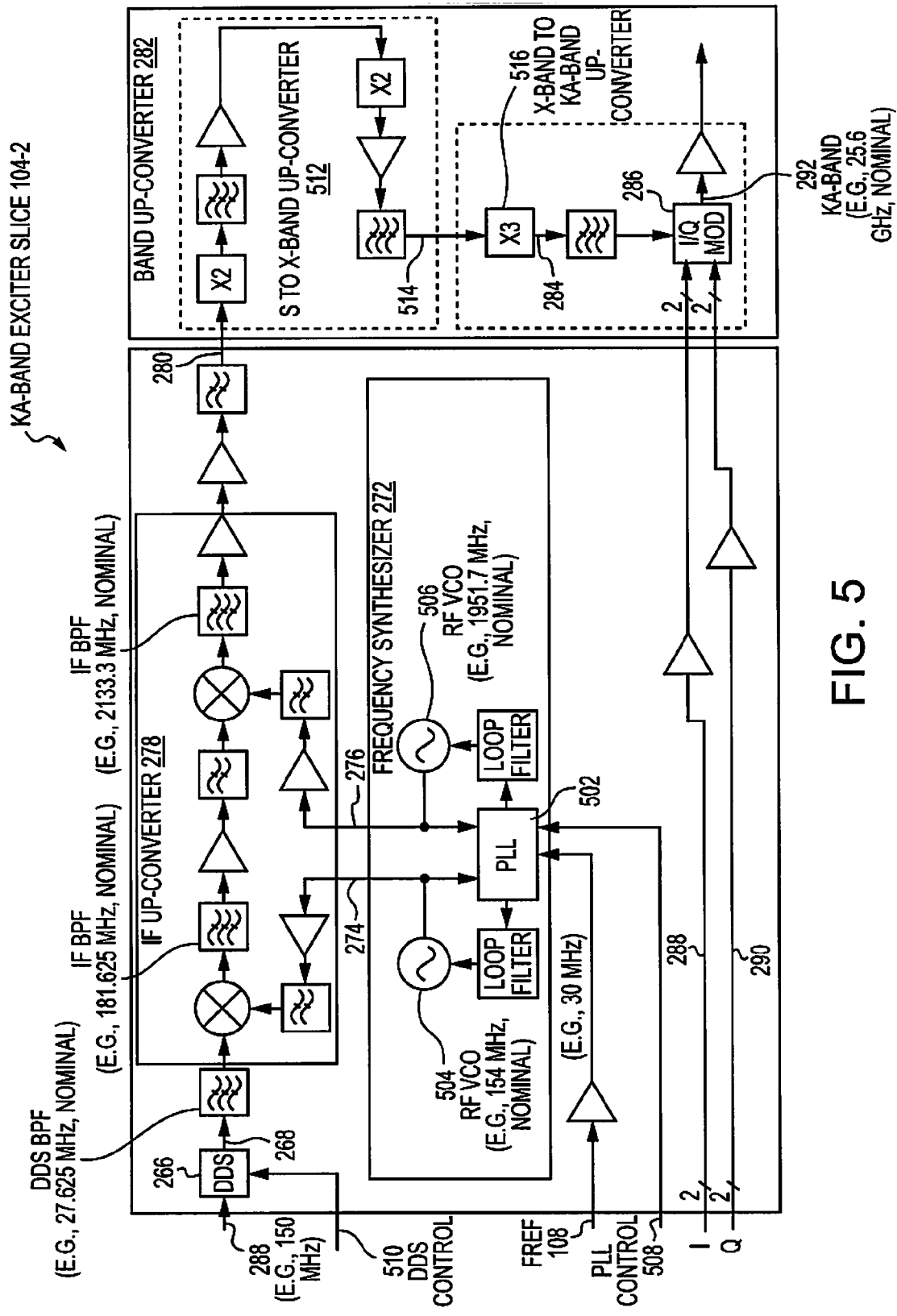
FIG. 5 is an exemplary block diagram of the Ka-band exciter slice.

FIG. 5 is an exemplary block diagram of Ka-band exciter slice 104-2, wherein frequency synthesizer 272 includes a dual phase locked loop (PLL) 502 and first and second voltage controlled oscillators 504 and 506, to generate first and second up-conversion reference signals 274 and 276, respectively, from reference signal fref 108. PLL 502 may be controllable by DSP 106 through a PLL control 508.

In FIG. 5, band up-converter 282 includes an S-to-X-band up-converter 512 to up-convert S-band carrier signal 280 to an X-band carrier signal 514, illustrated here as including two 2× frequency multipliers. Band up-converter 282 further includes an X-to-Ka-band up-converter 516 to up-convert X-band carrier signal 514 to Ka-band carrier signal 284.

Where an exciter slice 104 includes a frequency multiplier, a corresponding output may be filtered to compensate for non-linear effects of the multiplier, and I/Q modulation may be performed subsequent to the filtering, such as illustrated in FIG. 5, to avoid imparting non-linearity to the I/Q data.

Agility and precision of DDS modules within a receiver slice 102 and an exciter slice 104 may permit synthesis of an output the exciter slice 104 that is phase coherent with a received uplink carrier of the receiver slice 102.

For example, in FIG. 2, DSP 106 includes coherency calculator firmware 298 to generate tracking reference signals 246 and 270, corresponding to DSS modules 242 and 266, respectively, from carrier tracking signal 206. Coherency calculator 298 may be configured to control one or more of tracking reference signals 246 and 270 to provide coherency between receiver slice 102-1 and S-band exciter slice 104-1 and/or Ka-band exciter slice 104-2.

Figure 6:
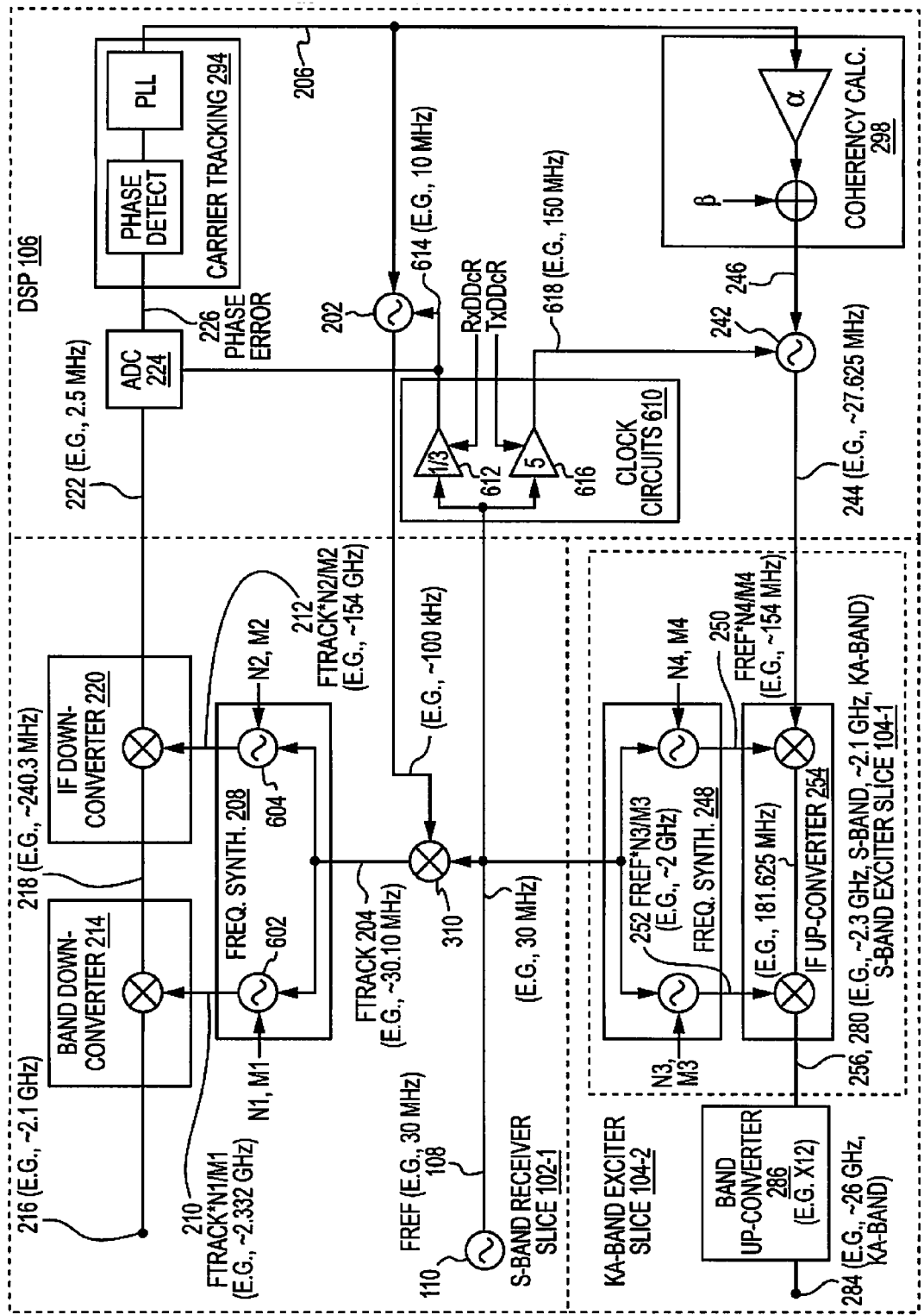
FIG. 6 is an exemplary block diagram of a coherent configuration of the SDR.

FIG. 6 is an exemplary block diagram of a coherent configuration of S-band receiver slice 102-1 and an exciter slice, which may correspond to one or more of S-band exciter slice 104-1 and, with the inclusion of band up-converter 286, Ka-band exciter slice 104-2.

With respect to Ka-band exciter slice 104-2, where band up-converter 282 includes a first and second 4× multiplication stages, one or more other stages of Ka-band exciter slice 104-2 may be re-tuned or reconfigured, such as to provide suitable coherence with a receiver slice 102.

In FIG. 6, receive path frequency synthesizer 208 includes with first and second frequency synthesizers 602 and 604, respectively, to generate first and second down-conversion reference signals 210 and 212 from reference tracking signal ftrack 204, in accordance with corresponding sets of numerical values N1, M1, and N2, M2.

Exciter path frequency synthesizer 248 is illustrated with first and second frequency synthesizers 606 and 608, respectively, to generate first and second up-conversion reference signals 250 and 252 from reference signal fref 108, in accordance with corresponding sets of numerical values N3, M3, and N4, M4.

Numerical values N1, M1, N2, M2, N3, M3, and N4, M4, may include integers and/or fractions of integers.

In FIG. 6, DSP 106 includes clock circuits 610, which may include one or more numerically-controlled frequency translators. In the example of FIG. 6, clock circuits 610 include a clock divider 612 to generate a reference signal 614 from reference signal fref 108, in accordance with a value RxDDcr, and a clock multiplier 616 to generate a reference signal 618 from reference signal fref 108, in accordance with a value TxDDcr. Clock divider 612 and clock multiplier 616 may be software-configurable.

Clock divider 612, DDS 202, and frequency translator 310 may synthesize system reference signals fref 108 with carrier tracking signal 206 to generate ftrack 204.

Coherency calculator 298 may be configured to apply compensation values α and β to tracking reference signal 246 to maintain a turn-around ratio between received signal 216 and carrier signal 256 in exciter slice 104-1, and/or carrier signal 284 in exciter slice 104-2, in accordance with a turn-around ratio TurnR. Values α and β may be determined to effectively remove effects of, or contributions from reference signal fref 108, from the turn-around ratio.

Clock multiplier 616 and DDS 242 may synthesize tracking reference signal 246, also referred to herein as a compensated carrier tracking signal, with system reference signal fref 108.

Compensation values α and β may depend, at least in part, on a hardware configuration of SDR 100 and the turn-around ratio. Compensation values α and β may be determined or calculated with reference to a combination of: a frequency of received signal 216, a frequency of carrier signal 256 and/or 284, a frequency of reference signal fref 108, values N1, M1, N2, M2, N3, M3, RxDDcr, TxDDcr, a turn-around ratio TurnR, and one or more nominal values. Frequency synthesis may include dithering to provide additional precision with respect to α and β. Exemplary equations to determine compensation values α and β are provided below with respect to FIG. 7. Determination of compensation values α and β is not, however, limited to the exemplary equations herein.

DSP 106 may include a plurality of software-selectable sets of compensation values α and β, each set corresponding to a turn-around ratio TurnR and a set of software-selectable configuration parameters. One or more sets of compensation values α and β may be pre-computed and stored within DSP 106 prior to a mission and/or may be uploaded during a mission.

Figure 7:
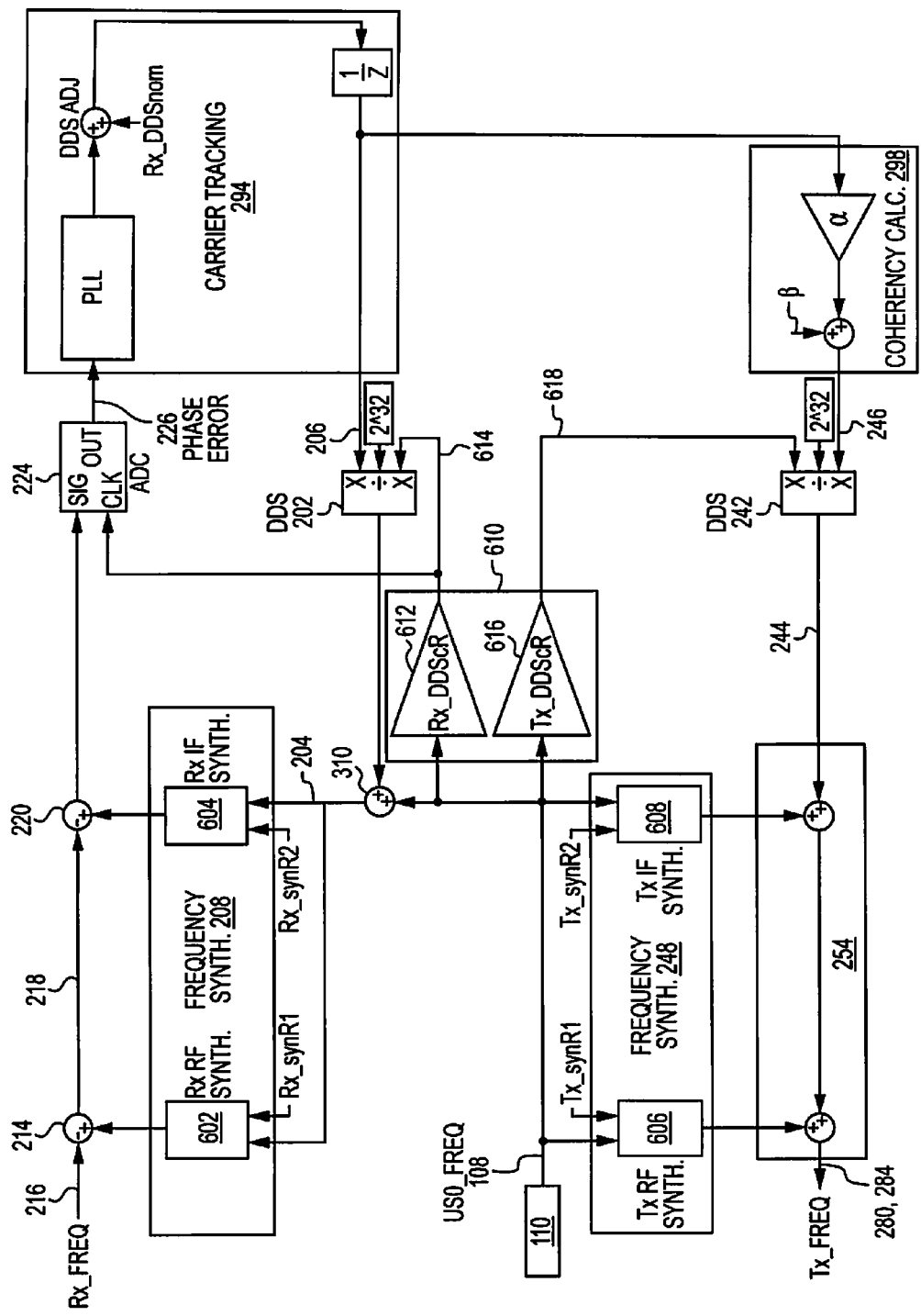
FIG. 7 is an exemplary simulator diagram of the SDR, corresponding to FIG. 6.

FIG. 7 is an exemplary simulator diagram of SDR 100, corresponding to FIG. 6.

In FIG. 7, USO_freq represents the frequency of system reference signal 108. Rx_freq represents the frequency of received signal 216. Tx_freq represents the frequency of up-converted carrier signal 256. Rx_synR1 represents numerical values N1 and M1. Rx_SynR2 represents numerical values N2 and M2. Tx_synR1 represents numerical values N3 and M3. Tx_SynR2 represents numerical values N4 and M4. RxDDScr represents a value applied to clock divider 612. TxDDScr represents a value applied to clock multiplier 616. Rx_DDSnom represents a nominal value that carrier tracking firmware 294 may add to carrier tracking signal 206. Tx_DDSnom represents a nominal value that may be added to carrier signal 206 prior, within, or subsequent to coherency calculator 298.

A set of values for Rx_freq, Tx_freq, USO_freq, Rx_synR1, Rx_SynR2, Tx_synR1, Tx_SynR2, Rx_DDScR, Tx_DDScR, Rx_DDSnom, α, β, may be determined for one or more turn-around ratios TurnR, in accordance with equations below:

$$Fa = a*(Rx\_freq/USO\_freq)+b;$$

$$Rx\_freq = (Fa-b)*USO\_freq/a; \text{ and}$$

$$USO\_freq = a*Rx\_freq/(Fa-b).$$

Where:

$$a = 1/(Rx\_DDScR*(Rx\_synR1-Rx\_synR2)); \text{ and}$$

$$b = -(1/Rx\_DDScR)*(1+1/(12*(Rx\_synR1-Rx\_synR2))).$$

$$Tx\_freq = USO\_freq*(Tx\_synR1+Tx\_synR2+Tx\_DDScr*Fb).$$

Where:

$$Fb = \alpha*Fa+\beta;$$

$$\alpha = TurnR/(Tx\_DDScR*a);$$

$$\beta = (-(Tx\_synR1+Tx\_synR2)/(Tx\_DDScR)-\alpha*b)*2^{32}.$$

An exemplary set of values are provided below for illustrative purposes. Methods and systems disclosed herein are not, however, limited to the exemplary values below.

$$Rx\_freq = 2092133333;$$

$$Rx\_DDSnom = 43480011;$$

$$Rx\_synR1 = (154+74/76)/2;$$

$$Rx\_synR2 = 121/15;$$

$$Rx\_DDScR = 1/3;$$

$$USO\_freq = 3*10^7;$$

$TurnR = 240/221;$ $Tx\_freq = 2271999999.63801;$ $Tx\_DDSnom = 23321089390;$ $Tx\_synR1 = (139+11/30)/2;$ $Tx\_synR2 = 77/15;$ and $Tx\_DDScR = 5.$ In FIG. 2, firmware 120 may include a plurality of processing components or cores, one or more of which may be software-configurable in response to software-defined parameters. A core may be configured to perform one or more particular processing tasks, and may be specifically designed and optimized with respect to the particular task(s). A core may be configured with software-programmable flexibility associated with the corresponding task(s). The combination of software and firmware associated with a core may be optimized to balance capability, power consumption, and logic gate count.

Multiple cores may be configured to interface, coordinate, and/or inter-operate with one another, such as under control of processor 116. The multiple cores may utilize one or more common clocks and/or a bus network.

A core may be configured in a modular fashion at a top level and at sublevels. Such multi-level modularity may reduce costs associated with firmware upgrades, such as to modify a personality of SDR 100 or a waveform.

Firmware 120 and associated software may provide RF hardware interface abstraction, user/host interface abstraction, firmware modularity, software re-configurability, in-flight waveform manipulation, and autonomous action.

Firmware 120 may include an application specific integrated circuit (ASIC), and may include a field programmable gate array (FPGA). A FPGA may include a fuse-based program-once FPGA and/or a re-writeable or reprogrammable FPGA, which may include one or more of SRAM and flash memory. A program-once FPGA may provide a greater degree of radiation hardness. A rewriteable FPGA may provide greater flexibility, such as for in-flight uploads.

Figure 8:
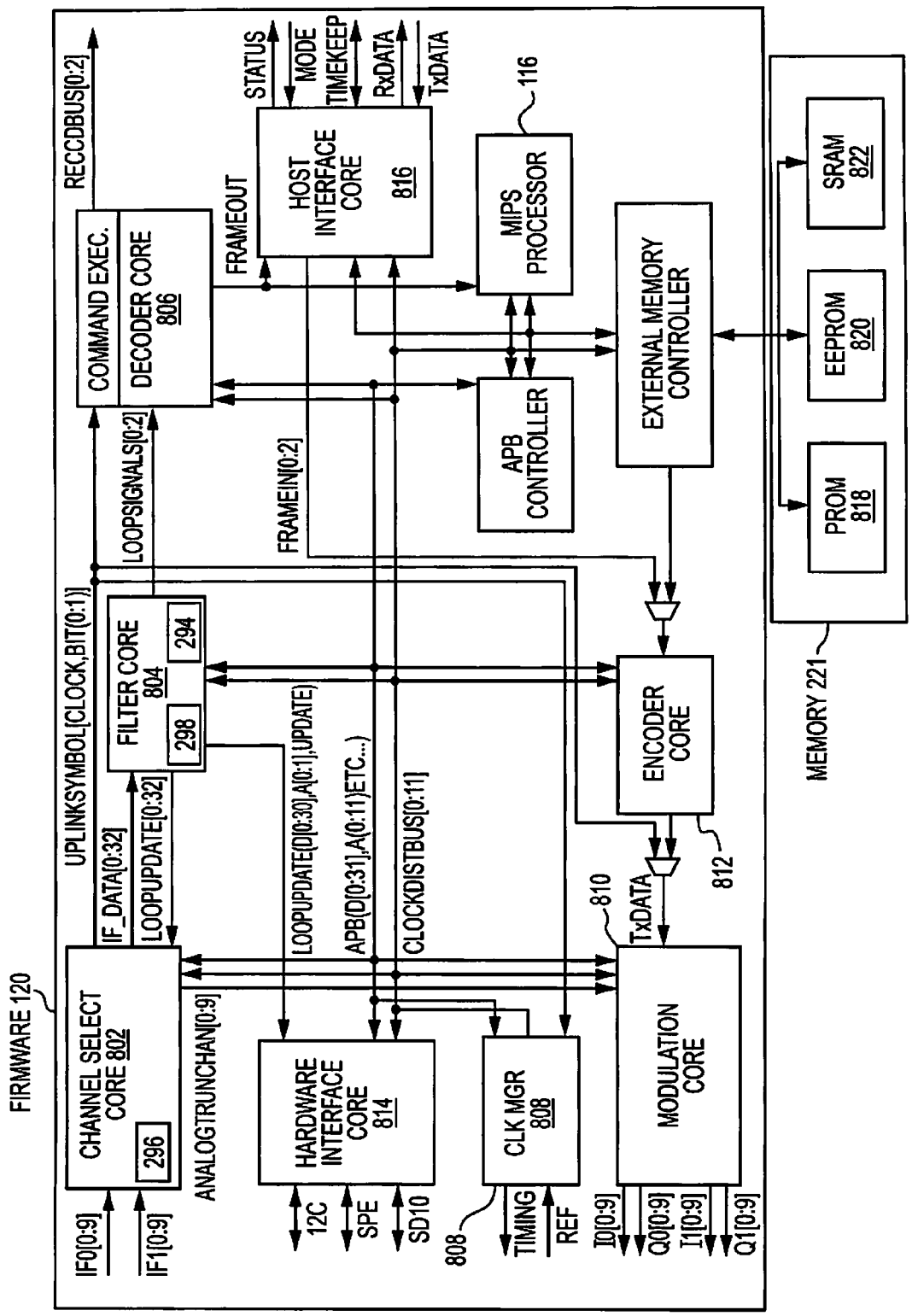
FIG. 8 is an exemplary block diagram of modular software-configurable firmware.

FIG. 8 is an exemplary block diagram of firmware 120. FIG. 8 includes exemplary interconnections associated with firmware 120. Firmware 120 is not, however, limited to the exemplary interconnections of FIG. 8.

A channel select core 802 may include software-configurable firmware to define, select, or re-configure up-conversion and down-conversion channel frequencies and bandwidths, such as described with respect to one or more examples above. Channel select core 802 may include demodulation firmware 296 in FIG. 2.

A filter core 804 may include software-configurable firmware to implement performance driving functions, such as loop filters, such as described in one or more examples above. Filter core 804 may include carrier tracking module 294 to generate carrier tracking signal 206, and coherency calculator firmware 298 to maintain a turn-around ratio, such as described above. Coherency calculator firmware 298 may include firmware to apply $\alpha$ and $\beta$, such as described above.

A decoder core 806 may correspond to decoder firmware 296, described above with respect to FIG. 2.

A clock manager core 808 may include software-configurable firmware to generate one or more clock signals from reference signal fref 108 in response to software-defined parameters, to be used by one or more components of SDR 100. Alternatively, or additionally, clock manager core 808 may include software-configurable firmware to apply one or more software-defined numerical values to one or more hardware-based numerically-controlled clock circuits.

A modulation core 810 may include software-configurable firmware to implement modulation, such as described with respect to one or more examples above.

An encoder core 812 may include software-configurable firmware to implement one or more encoding techniques in accordance with software-defined parameters. Encoder core 812 may include, for example, turbo encoding firmware. Encoder core 812 may be software-configurable to operate with respect to multiple rates and frame sizes without modification of firmware 120. The multiple rates and frame sizes may correspond to a Consultative Committee for Space Data Systems (CCSDS) standard, such as a CCSDS 131.0-B-1 standard, titled "TM Synchronization and Channel Coding," published in September 2003 by the CCSDS Secretariat, Office of Space Communication (Code M-3), National Aeronautics and Space Administration, Washington, D.C. 20546.

Encoder core 812 may be implemented in a modular fashion, such that one or more sub-cores associated with corresponding encoding frameworks may be added to or removed from encoder core 812 with little or no impact on other cores or sub-cores. Encoder core 812 may include, for example, a low density parity check (LDPC) encoder core.

A hardware interface core 814 may include firmware to provide a relatively abstract interface to devices and sensors throughout SDR 100. Hardware interface core 814 may permit processor 116 to manipulate hardware slices and to support multiple receiver slices 102 and multiple exciter slices 104. Hardware interface core 814 may be configured to permit SDR 100 to operate with less than all permitted slices installed. For example, and without limitation, hardware interface core 814 may be configured to support up to two receiver slices 102 and up to two exciter slices 104, and may be operable with less than two receiver slices 102 and/or two exciter slices 104. Hardware interface core 814 may be configured to provide variable refresh rates, such as to scale power consumption with capability. Hardware interface core 814 may be configured to initiate device scrubbing/reloading and/or failure detection and correction, such as in response to external device radiation faults.

A host interface core 816 may include firmware to provide a relatively abstract interface of SDR 100 to host 112 or other systems, alone or in combination with processor 116. Host interface core 816 may be implemented with a modular firmware configuration, which may permit customization of physical and electrical layers associated with radio interfaces, and which may permit SDR 100 to be reconfigured for different missions with little or no impact to other modules of the interface firmware. This may reduce non-recurring engineering (NRE) costs. Software associated with processor 116, which may include C code, may serve to abstract away relatively complex status collection and mode command routines. The software may be configured to provide various levels of in-flight reprogram-ability, which may vary amongst missions.

Firmware 120 may include firmware to monitor voltages and temperatures within SDR 100, which may be available as software-defined status telemetry points through interface 114 in FIG. 1. Interface 114 may include multi-master serial computer bus, such as an inter-integrated circuit (I2C) bus, to permit monitoring of voltages, temperature, and/or other sensors, within SDR 100 and/or external of SDR 100.

In FIG. 2, DSP 106 may include memory 221. In FIG. 8, memory 221 may include one or more of programmable read-only memory (PROM) 818, which may be used to store default or failsafe radio personalities and software, electrically erasable PROM (EEPROM) 820, which may be used to store uploaded software-defined parameters or radio personalities, and static random access memory (SRAM) 822 for scratch and other temporary storage.

In FIG. 2, power converter 124 may be configured to generate a core set of one or more voltage levels, and S-band receiver slice 102-1, exciter slices 104-1 and 104-2, and DSP 106 may be configured to generate corresponding custom voltages from the standard secondary voltages. Power converter 124 may provide independent voltage banks for receiver slices 102, exciter slices 104, reference oscillator 110, and DSP 106, and may provide voltage sequencing within one or more of the banks, and may synchronize to reference oscillator 110.

Where power converter 124 operates on a single primary bus voltage input, DSP 106 and/or host 112 may be configured to gate voltages associated with receiver slices 102 and exciter slices 104. Gating may be implemented within power converter 124 and/or within receiver slices 102 and exciter slices 104.

SDR 100 may be configured with a pulse-off feature to momentarily turn off power converter 124, or portions thereof. This may reduce risk of damage where, for example, a primary bus voltage is hard-wired on. A pulse-off feature may be used to recover from single event effects due to radiation.

A plurality of exciter slices 104 may share a power converter secondary voltage bank, and may be configured to be independently gated on and off, such as with field-effect transistor (FET) switches within exciter slices 104, controlled by firmware 120.

Methods and systems disclosed herein may be implemented to provide desired RF performance and frequency band coverage with relatively low mass and low power consumption, and may be implemented substantially with commercially available components, which may reduce development and manufacturing costs. Alternatively, or additionally, band tuning capability may be provided with future monolithic microwave integrated circuit (MMIC) based voltage-controlled oscillators (VCOs) having relatively low-phase noise and low-power consumption.

A modular SDR, as disclosed herein, may be readily upgradeable with future technology and/or modified for other applications.

The Unites States National Aeronautics and Space Administration (NASA) has promulgated a Space Telecommunications Radio System (STRS) specification to define a standard architecture for space-qualified radios in support of NASA missions. STRS version 1.0 was released December 2005. SDR 100, or portions thereof, may be configured in accordance with a Space Telecommunications Radio System (STRS) specification promulgated by NASA, such as version 1.0, released December, 2005, and/or subsequent versions.

Additional exemplary parameters and corresponding exemplary configurations of SDR 100 are provided in Table 1 below.

TABLE 1

| Parameter | Exemplary Configuration |
| --- | --- |
| Compatibility | TDRSS DG2 non-spread services (Single Access) STRS-00001 compatible SPM & RFM; GPM HAL/API on space craft Host under development Capable of in-flight reconfiguration and personality updates; PROM & EEPROM for 4 personalities + 1 default |
| Mass | 2.1 Kg w/0.1" Al chassis (1.8 Kg estimated w/0.1" Mg alloy) |
| Bus Power | 16.8 W, 10M/50M/1 Mbps, OCXO warmup, flight FPGA estimated, all temperatures, all bus voltages (+22 to +34 V) 11.4 W, 10M/10M/1 Mbps, OCXO at steady state, flight FPGA estimated, +28 V, +25° C. 5.3 W, S-band Rx @ 1 Mbps, OCXO at steady state. +28 V, +25° C. |
| Temperature | operating in spec.: −25° C. to +55° C., ON survival: −35° C. to +65° C., cold start: −35° C., storage: −35° C. to +85° C. |
| Radiation | TID ≧50 Krads (Si) component tolerance at a shielding depth of 100 mils Aluminum; higher tolerance options available via spot and other shielding LET for SEL ≧80 MeV/mg/cm^2 SEU: Error checking and correcting firmware included |
| Interfaces | LVDS Command/Telemetry (In-test), upgradeable to Spacewire and others; RS-422 baseband telemetry output; LVDS UART Mode/Status (In-test), upgradeable to Spacewire and others Serial Test Interface: LVDS or RS-232, upgradeable to others |
| S-band Exciter | 2200-2300 MHz. <1 mHz step resolution CW, BPSK, QPSK, PM: in-test: SQPSK, subcarrier, M-PSK & M-QAM (up 16) 1 bps to ~75 Mbps (modulator-limited) uncoded; typically further limited by NTIA mask +12 dBm +/−2 dB output power programmable modulation index. <1° resolution, up to 64 hot swappable I/Q calibration sets BER loss @ 10^−6 bit error rate (no NTIA mask): 0.5 dB (100 Kbps 45* PM); 0.5 dB (12.5 Mbps BPSK); 0.6 dB (25 Mbps QPSK) over temperature |
| Ka-band Exciter | 25.5-26.0 GHz, <1 mHz step resolution for 25.5-26.0 GHz, returnable on ground within 25.25-27.0 GHz CW, BPSK, QPSK, PM (45° pk), other mod indices w/backoff; in-test: SQPSK 1 bps to 25 Mbps (modulator-limited) uncoded; +5 dBm +/−2 dB output power. w/ext, coax attenuator BER loss @ 10^−6 bit error rate (no NTIA mask): 1.0 dB (100 Kbps 45° PM); 1.1 dB (125 Mbps BPSK); 1.2 dB (25 Mbps QPSK) over temperature |
| Data Encoder | programmable data formats: NRZ, Bi-phase, RZ. Differential programmable encoder: Convolutional (R = ½) and Turbo (R = ½, all CCSDS frame sizes, in-test), ≦30 Mbps data. randomizer; upgradeable firmware core; programmable PN test patterns: PRN7, PRN15, PRN20, PRN23, 16-bit user pattern |
| S-band Receiver | 2025-2120 MHz, <1 mHz step resolution CW, BPSK, QPSK: to be tested: PM/subcarrier (programmable frequency) 1 bps-1.25 Mbps (uncoded) +10 dBm maximum input w/o damage Noise figure: 3.4 dB @ 25° C., ≦4.5 dB over temperature carrier tracking threshold: ≦−150 dBm verified: reprogrammable; lower thresholds w/deep space personality dynamic range: threshold to −70 dBm BER loss @ 10^−5 bit error rate: 0 dB at 2000 bps BPSK; 0.4 dB at 500 Kbps BPSK; 1.2 dB at 1 Mbps QPSK over temperature programmable carrier tracking loop BW (2Bl): 0.1 Hz to 3 KHz, depending on configuration and received signal level, with corresponding increase/decrease in maximum tracking rate and sensitivity. |
| Data Decoder | programmable data formats: NRZ, Bi-phase. Differential critical command decoder (CCD) w/8-bit CMD word under development firmware upgradeable options: Viterbi and LDPC decoders, bit error rate tester firmware/hardware upgradeable options: spread spectrum decoder |
| Coherency | programmable S/S-band and S/Ka-band turn around ratio, within precision of above frequency step resolutions |

TABLE 1-continued

| Parameter | Exemplary Configuration |
|---|---|
| | Allan Deviation ≦6.7E−14 @ 60 s, −70 dBm Rx (equivalent to ≦0.01 mm/s range-rate) for S/S-band configuration |

One or more features disclosed herein may be implemented in hardware, software, firmware, and combinations thereof, including discrete and integrated circuit logic, application specific integrated circuit (ASIC) logic, and microcontrollers, and may be implemented as part of a domain-specific integrated circuit package, or a combination of integrated circuit packages. The term software, as used herein, refers to a computer program product including a computer readable medium having computer program logic stored therein to cause a computer system to perform one or more features and/or combinations of features disclosed herein.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A non-transitory computer-readable medium-defined radio system, comprising:
   a hardware-based receiver module to frequency down-convert a received signal in accordance with one or more down-conversion reference signals;
   a software-configurable carrier tracking system to generate a receive path carrier tracking signal from the received signal in accordance with corresponding software-defined parameters;
   a first numerically-controlled oscillator system to synthesize a system reference signal with the receive path carrier tracking signal in accordance with one or more corresponding software-defined numerical values;
   a first numerically-controlled frequency synthesizer to frequency up-convert the synthesized system reference signal in accordance with one or more corresponding software-defined numerical values to generate the one or more down-conversion reference signals;
   a coherency calculation system to apply software-defined compensation values to the receive path carrier tracking signal to generate a compensated carrier tracking signal, wherein the compensation values are associated with channel configuration parameters and a turn-around ratio;
   a second numerically-controlled oscillator system to synthesize the compensated carrier tracking signal with the system reference signal in accordance with one or more corresponding software-defined numerical values to generate an exciter path carrier signal coherent with the received signal;
   a second numerically-controlled frequency synthesizer to frequency up-convert the system reference signal in accordance with one or more corresponding software-defined numerical values to generate one or more up-conversion reference signals; and
   a hardware-based exciter module to frequency up-convert the exciter path carrier signal in accordance with the one or more up-conversion reference signals.

2. The system of claim 1, further including:
   a software-configurable channel select system to apply one of a plurality of software-selectable sets of channel configuration parameters, including the numerical values associated with the first and second numerically-controlled frequency synthesizers, the numerical values associated with the first and second numerically-controlled oscillator systems, and the compensation values.

3. The system of claim 2, wherein the numerical values associated with the first and second numerically-controlled frequency synthesizers are in the form of N/M, where N and M each include an integer and wherein one or more of the values N further include a fraction.

4. The system of claim 2, wherein at least a sub-set of the plurality of software-selectable sets of channel configuration parameters are configured with respect to corresponding frequency bands that differ from one another.

5. The system of claim 1, wherein:
   the first numerically-controlled oscillator system includes a first numerically-controlled frequency translator to generate a first clock signal from the system reference signal in accordance with a first software-defined numerical value, a first numerically-controlled oscillator to synthesize and frequency translate the receive path carrier tracking signal and the first clock signal in accordance with a second software-defined numerical value to generate a synthesized tracking signal, and a frequency translator to frequency translate the system reference signal in accordance with the synthesized tracking signal to generate the synthesized system reference signal; and
   the second numerically-controlled oscillator system includes a second numerically-controlled frequency translator to generate a second clock signal from the system reference signal in accordance with a third software-defined numerical value, a second numerically-controlled frequency oscillator to synthesize and frequency translate the compensated carrier tracking signal and the second clock signal in accordance with a fourth software-defined numerical value to generate the exciter path carrier signal.

6. The system of claim 5, further including:
   a software-configurable channel select system to apply one of a plurality of software-selectable sets of channel configuration parameters, including the numerical values associated with the first and second numerically-controlled frequency synthesizers, the second and fourth numerical values associated with the first and second numerically-controlled oscillators, and the compensation values; and
   a clock manager system to provide one of a plurality of software-selectable sets of the first and third numerical values associated with the first and second numerically-controlled frequency translators.

7. The system of claim 5, wherein:
   the one or more up-conversion reference signals include first and second up-conversion reference signals;
   the one or more down-conversion reference signals include first and second down-conversion reference signals;

the coherency calculation system is configured to multiply the receive path carrier tracking signal by a compensation value α, and to add a compensation value β to a result of the multiplication by the compensation value α; and the compensation values α and β are determined in accordance with, $Fa = a*(Rx\_freq/USO\_freq)+b,$ $Rx\_freq = (Fa-b)*USO\_freq/a,$ $USO\_freq = a*Rx\_freq/(Fa-b),$ $a = 1/(Rx\_DDScR*(Rx\_synR1-Rx\_synR2)),$ $b = -(1/Rx\_DDScR)*(1+1/(12*(Rx\_synR1-Rx\_synR2))),$ $Tx\_freq = USO\_freq*(Tx\_synR1+Tx\_synR2+Tx\_DDScr*Fb),$ $Fb = \alpha*Fa+\beta,$ $\alpha = TurnR/(Tx\_DDScR*a),$ and $\beta = (-(Tx\_synR1+Tx\_synR2)/(Tx\_DDScR)-\alpha*b)*d,$ wherein, Rx_freq represents a frequency of the received signal, Rx_freq represents an output frequency of the hardware-based exciter module, Rx_synR1 represents a numerical value N1/M1 associated with the first down-conversion reference signal, Rx_synR2 represents a numerical value N2/M2 associated with the second down-conversion reference signal, Tx_synR1 represents a numerical value N3/M3 associated with the first up-conversion reference signal, Tx_synR2 represents a numerical value N4/M4 associated with the second up-conversion reference signal, Rx_DDScR represents the first numerical value associated with the first clock signal, Tx_DDScR represents the third numerical value associated with the second clock signal, d represents the fourth numerical value associated with second numerically-controlled oscillator, and TurnR represents the turn-around ratio.

8. The system of claim 1, wherein the compensation values are computed to reduce an impact of the system reference signal on the exciter path carrier signal with respect to a turn-around ratio.

9. The system of claim 1, wherein at least a portion of the first and second numerically-controlled frequency synthesizers are implemented within a digital signal processor.

10. The system of claim 9, wherein at least a portion of the first and second numerically-controlled frequency synthesizers are implemented in software-configurable firmware.

11. The system of claim 1, wherein the first and second numerically-controlled frequency synthesizers are configured to perform dithering.

12. The system of claim 1, wherein the first and second numerically-controlled oscillator systems each include a corresponding direct digital synthesizer.

13. The system of claim 1, wherein the SDR system is configured to support a plurality of receiver modules and exciter modules, and is operable with less than all of the plurality of receiver and exciter modules installed, the system further including:

a channel select system to apply one of a plurality of software-selectable sets of channel configuration parameters with respect to each installed receiver and exciter module, including numerical values associated with corresponding numerically-controlled frequency synthesizers and numerically-controlled oscillator systems, and corresponding compensation values.

14. The system of claim 1, further including:

a software-configurable channel select system to apply one of a plurality of software-selectable sets of channel configuration parameters, including the numerical values associated with the first and second numerically-controlled frequency synthesizers, the numerical values associated with the first and second numerically-controlled oscillator systems, and the compensation values, wherein the channel select system includes a software-configurable demodulation system to demodulate data from down-converted received signals;

a software-configurable filter system, including the carrier tracking system and the coherency calculation system;

a software-configurable decoder system to decode demodulated data;

a software-configurable clock manager system to apply numerical values to one or more clock frequency translators;

a software configurable encoder system to provide one or more software-configurable encoding frameworks;

a software-configurable modulation system to modulate the exciter path carrier signal with encoded data;

a software-configurable hardware interface system to control the hardware-based receiver and exciter modules; and a software-configurable host interface system to provide an interface to the SDR system with respect to a host system;

wherein one or more of the software-configurable systems include one or more sub-systems specifically configured with respect to one or more corresponding functions.

15. The system of claim 14, further including:

a processor;

memory to store software-defined configuration parameters; and computer program logic to cause the processor to provide software-defined configuration parameters to corresponding software-configurable systems.

16. The system of claim 14, wherein the host interface system is configured to apply software-configurable parameters to one or more other systems in response to instructions received from a host processor.

17. A non-transitory computer-readable medium for generating conversion signals associated with a software defined radio system, the non-transitory computer-readable medium including instructions stored therein and accessible by a hardware processing arrangement, wherein, when the hardware processing arrangement executes the instructions, the hardware processing arrangement is configured to perform at least one method, said method comprising:

applying one of a plurality of software-selectable sets of channel configuration parameters to the software defined radio system, including applying numerical values to first and second numerically-controlled frequency synthesizers and to first and second numerically-controlled oscillator systems, and applying compensation values to a coherency calculation system, wherein the compensation values are associated with a turn-around ratio;

synthesizing a system reference signal with a receive path carrier tracking signal responsive to the first numerically-controlled oscillator system;

frequency up-converting the synthesized system reference signal responsive to the first numerically-controlled frequency synthesizer to generate one or more down-conversion reference signals;

frequency down-converting a received signal in accordance with the one or more down-conversion reference signals;

applying the compensation values to the receive path carrier tracking signal responsive to the coherency calculation system to generate a compensated carrier tracking signal;

synthesizing the compensated carrier tracking signal with the system reference signal responsive to the second numerically-controlled oscillator system to generate an exciter path carrier signal coherent with the received signal;

frequency up-converting the system reference signal responsive to the second numerically-controlled frequency synthesizer to generate one or more up-conversion reference signals; and frequency up-converting the exciter path carrier signal in accordance with the one or more up-conversion reference signals.

18. The method of claim 17, wherein:

the first numerically-controlled oscillator system includes a first numerically-controlled frequency translator, a first numerically-controlled oscillator, and a frequency translator;

the second numerically-controlled oscillator system includes a second numerically-controlled frequency translator and a second numerically-controlled oscillator;

the applying of the channel configuration parameters includes applying corresponding software-defined numerical values to the first and second numerically-controlled frequency translators and to the first and second numerically-controlled frequency oscillators;

the synthesizing of the system reference signal with the receive path carrier tracking signal includes frequency translating the system reference signal responsive to the first numerically-controlled frequency translator to generate a first clock signal, synthesizing and frequency translating the receive path carrier tracking signal and the first clock signal responsive to the first numerically-controlled oscillator to generate a synthesized tracking signal, and frequency translating the system reference signal in accordance with the synthesized tracking signal to generate the synthesized system reference signal; and the synthesizing of the compensated carrier tracking signal with the system reference signal includes frequency translating the system reference signal responsive to the second numerically-controlled frequency translator to generate a second clock signal, and synthesizing and frequency translating the compensated carrier tracking signal and the second clock signal responsive to the second numerically-controlled oscillator to generate the exciter path carrier signal.

19. A non-transitory computer-readable medium-defined radio system, including:

a first numerically-controlled oscillator system to synthesize a receive path carrier tracking signal with a system reference signal;

a first numerically-controlled frequency synthesizer to generate one or more down-conversion reference signals responsive to the synthesized system reference signal;

a software-configurable compensation calculation system to apply software-defined compensation values to the receive path carrier tracking signal, wherein the compensation values are determined to reduce an effect of the system reference signal on a turn-around ratio;

a second numerically-controlled oscillator system to synthesize the compensated carrier tracking signal with the system reference signal to generate an exciter path carrier signal coherent with the receive path carrier tracking signal;

a second numerically-controlled frequency synthesizer to generate one or more up-conversion reference signals responsive to the system reference signal; and a software-configurable channel select system to apply one of a plurality of software-selectable sets of channel configuration parameters, including numerical values associated with first and second numerically-controlled frequency synthesizers, numerical values associated with first and second numerically-controlled oscillator systems, and the compensation values.

20. The system of claim 19, wherein the first and second numerically-controlled oscillator systems each include a direct digital synthesizer.

* * * * *